(12) United States Patent
Liu et al.

(10) Patent No.: US 8,568,827 B2
(45) Date of Patent: Oct. 29, 2013

(54) TEXTURED COATING ON A COMPONENT SURFACE

(75) Inventors: Shuangbio Liu, Dunlap, IL (US); Chuong Quang Dam, Peoria, IL (US); Bao Feng, Dunlap, IL (US); Dongyun Hua, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 409 days.

(21) Appl. No.: 12/781,102

(22) Filed: May 17, 2010

(65) Prior Publication Data

US 2010/0221425 A1  Sep. 2, 2010

Related U.S. Application Data

(63) Continuation-in-part of application No. 11/606,178, filed on Nov. 30, 2006, now abandoned.

(51) Int. Cl.
*B21D 53/10* (2006.01)
*F16C 33/10* (2006.01)
*F16C 32/06* (2006.01)
*C23C 16/26* (2006.01)

(52) U.S. Cl.
USPC .......... 427/249.7; 384/13; 384/293; 384/100; 29/898.02; 427/259; 427/272; 427/282

(58) Field of Classification Search
None
See application file for complete search history.

(56) References Cited

U.S. PATENT DOCUMENTS

| | | | | |
|---|---|---|---|---|
| 2,517,430 A | * | 8/1950 | Hensel et al. | 427/272 |
| 4,974,498 A | * | 12/1990 | Lemelson | 92/223 |
| 5,017,264 A | | 5/1991 | Yamazaki et al. | |
| 5,288,556 A | * | 2/1994 | Lemelson | 428/408 |
| 5,366,298 A | * | 11/1994 | Toshimitsu et al. | 384/107 |
| 5,605,759 A | * | 2/1997 | Prince et al. | 428/408 |
| 6,427,330 B1 | * | 8/2002 | Kobayashi et al. | 29/898.02 |
| 6,582,126 B2 | * | 6/2003 | North | 384/276 |
| 2003/0224201 A1 | * | 12/2003 | Kawakami et al. | 428/672 |
| 2006/0040435 A1 | * | 2/2006 | Morisue et al. | 438/151 |
| 2006/0133901 A1 | | 6/2006 | Hackman | |
| 2007/0297473 A1 | | 12/2007 | Miyajima et al. | |
| 2008/0131604 A1 | | 6/2008 | Liu et al. | |
| 2008/0188383 A1 | | 8/2008 | Iseki et al. | |

FOREIGN PATENT DOCUMENTS

JP  02-256917  * 10/1990

OTHER PUBLICATIONS

English translation of JP 02-256917.*

* cited by examiner

*Primary Examiner* — Timothy Meeks
*Assistant Examiner* — Mandy Louie
(74) *Attorney, Agent, or Firm* — Miller, Matthias & Hull

(57) ABSTRACT

The present disclosure is directed to a method of making a textured coating on a wear surface of a component. The method includes applying a mask on the surface and depositing a tribological coating on the surface. The method further includes removing the mask.

18 Claims, 3 Drawing Sheets

TEXTURED COATING ON A COMPONENT SURFACE

CROSS-REFERENCE TO RELATED APPLICATIONS

This is a continuation-in-part to U.S. patent application Ser. No. 11/606,178, filed on Nov. 30, 2006.

TECHNICAL FIELD

The present disclosure relates generally to a method of making a textured coating on a component surface, and more particularly, to a method of making a textured coating on the surface of a component that is subject to friction.

BACKGROUND

In a machine, there are component parts that are designed to rub together during operation. Some examples are bearings, gears, cams, tappets, pistons, rings, fuel injector plungers, bearings, cams/followers, transmission components and hydraulic system components such as hydraulic pumps. In these components, two surfaces come into contact, support (or subject to) a load, and move with respect to each other (hereinafter referred to as frictional contact). While these surfaces may look smooth on a macroscopic scale, they may contain many irregularities (called asperities) on a microscopic scale. When two microscopically rough component surfaces undergo frictional contact, physical contact and load transfer occur at the asperities. The high local pressure at points of contact cause the asperities to deform plastically and form microscopic adhesive junctions at the contact points. When these components undergo relative motion, the adhesive junctions are sheared and new junctions are formed. This repeated shearing and reestablishment of adhesive junctions cause material removal. This process is referred to as wear. Wear may also be caused in surfaces under frictional contact by other mechanisms. Due to the various wear mechanisms, the dimensions of the component and/or the strength of the component may change. Wear limits the durability of a machine component that undergoes frictional contact. A component that includes surfaces, which undergo frictional contact, will be referred to as wear components, and the surfaces that undergo frictional contact will be referred to as wear surfaces.

Engineered surface treatments are applied to surfaces under frictional contact to reduce friction and wear, and thereby improve durability. These surface treatments can be broadly classified as treatments that alter the surface texture of the component and treatments that change the surface chemistry of the component. Examples of treatments that alter the surface texture of a component include chemical and/or mechanical polishing of the surface using vibratory finishing, laser texturing, stone honing, shot-peening, mechanical dimpling/grooving etc. Examples of treatments that change the surface chemistry of a component include tribological coatings.

Tribological coatings include doped/undoped amorphous carbons (diamond like carbon, "DLC"), amorphous hydrocarbons, metal carbides, metal nitrides, metal dichalcogenides, metal borides, etc. Surface texture modifications reduce wear by reducing the heights of the asperities and/or by providing miniature reservoirs to trap the lubricant and/or debris. Tribological coatings decrease component wear by reducing the formation of adhesive joints and by providing a hard surface to resist material removal or, in other words, to increase wear resistance. To harness the wear resistant qualities of both types of engineered surface treatments, textured surfaces can be formed on tribological coatings. A tribological coating may be first deposited on a surface and the texture formed on the coating. Surface texturing techniques such as machining, laser surface texturing, etc. are most often used to create these textured surfaces on the tribological coating.

Textured tribological coatings and methods of making these coatings on surfaces under frictional contact are described in U.S. Patent Publication No. US 2005/0175837 A1 issued to Massler et al. on Aug. 11, 2005 (hereinafter the '837 publication). In the methods of the '837 publication, uniform layers of different tribological coatings are applied to a component surface using physical vapor deposition or chemical vapor deposition processes. Grooving (texturing) of the tribological coatings is then carried out using an excimer laser system. While the textured tribological coatings of the '837 publication may improve the wear resistance of the component, making the textured tribological coatings as disclosed in '837 publication have significant limitations. For instance, surface-texturing using a laser may damage the component due to excessive localized heat. Individually forming the grooves (that make up the surface texture) using a laser may be expensive for mass produced components, both due to high equipment costs and increased process time/complexity. In addition, the method of the '837 publication does not disclose a method of re-applying the tribological coating when the initial coating wears out. Therefore, although the wear resistance of the component may be increased by methods disclosed in the '837 patent, the component may still require replacement when the initial textured tribological coating wears out. Other known processes rely upon the use of chemical vapor deposition (CVD), which requires temperatures exceeding 500° C., and is therefore unsuitable for many components or substrates.

The present disclosure is directed at overcoming one or more of the shortcomings of the prior art textured tribological coatings.

SUMMARY OF THE DISCLOSURE

In one aspect, the present disclosure is directed to a method of making a textured coating on a surface of a component including, but not limited to as fuel injector plungers, gears, pistons, rings, bearings, cams/followers, transmission components and hydraulic system components such as hydraulic pumps. The method includes applying a mask on the surface and depositing a tribological coating on the surface. The method further includes removing the mask.

In another aspect, the present disclosure is directed to a method of making a textured coating on a surface of a machine component including, but not limited to as fuel injector plungers, gears, pistons, rings, bearings, cams/followers, transmission components and hydraulic system components such as hydraulic pumps. The method includes applying a first mask to the surface in a first pattern and depositing a first tribological coating on the surface. The method also includes removing the first mask to obtain a first tribological coating pattern. The machine component is then operated such that the first tribological coating pattern will be subject to wear. The method further includes depositing a second tribological coating pattern on the surface.

In yet another aspect, the present disclosure is directed to a method of making a coating on a surface of a machine part including, but not limited to as fuel injector plungers, gears, pistons, rings, bearings, cams/followers, transmission components and hydraulic system components such as hydraulic pumps. The method includes attaching a resin mask to the surface to cover a first portion of the surface and expose a second portion of the surface. The method also includes applying a coating on the second portion and removing the resin mask from the surface after applying the coating.

DETAILED DESCRIPTION

Figure 1:
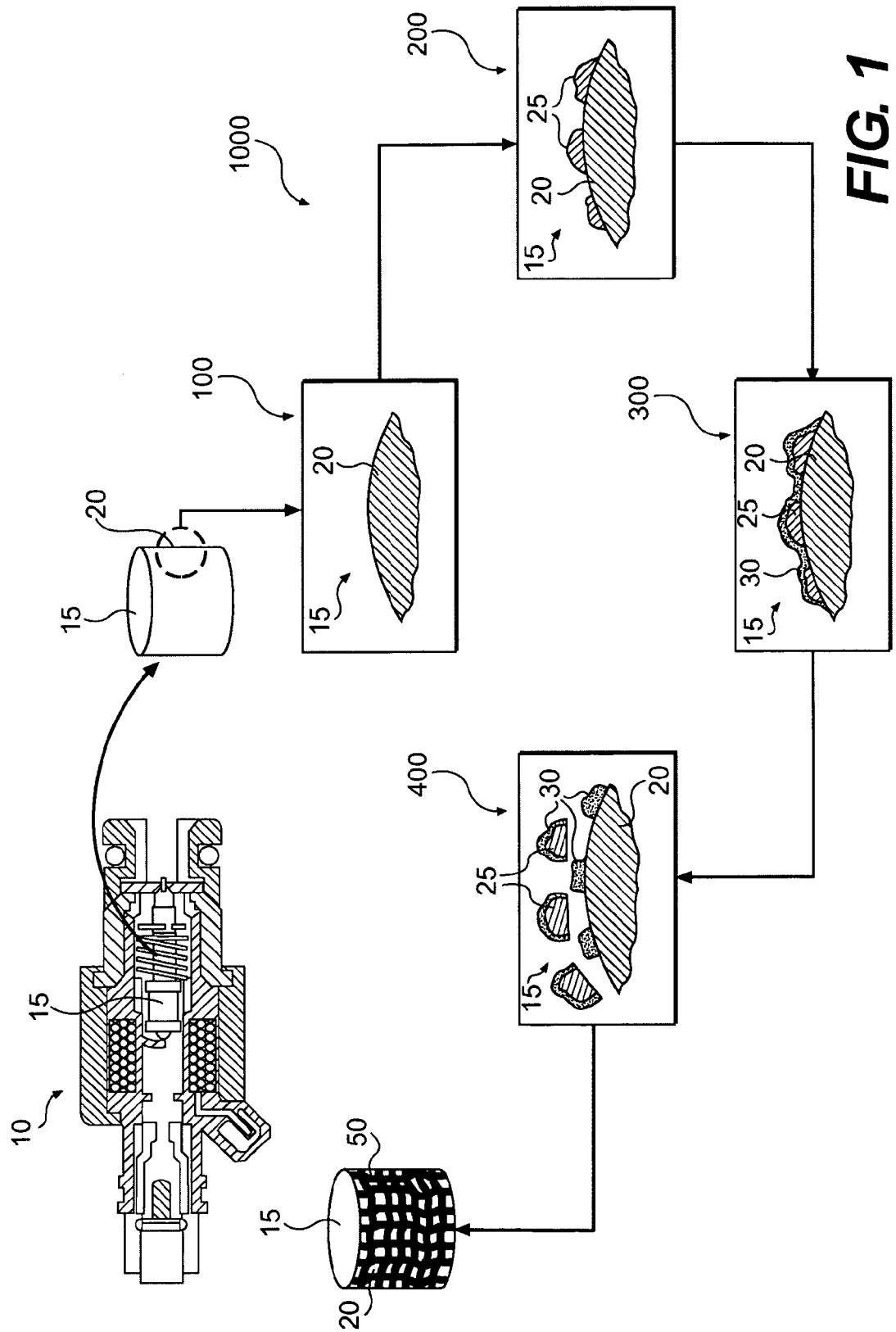
FIG. 1 is a diagrammatic illustration of an exemplary method of making a textured coating on the surface of a component.

FIG. 1 illustrates a method 1000 of making a textured coating 50 on a surface 20 of a machine component 15. In this specification, the term-textured coating is used to refer to a tribological coating with an intentionally created pattern on the surface of the coating. The surface 20 may be any surface of a component 15, such as, but not limited to as fuel injector plungers, gears, pistons, rings, bearings, cams/followers, transmission components and hydraulic system components such as hydraulic pumps. The component 15 may be any component of a machine or more complex component 10, such as a fuel injector as shown in FIG. 1. The component 15 may include a new component or a used component. A new component may be a newly manufactured component, and a used component may be a component that has previously been used. The used component may include components that have any degree of wear due to the prior use. The machine component 10 may be any part of a machine that performs some type of operation associated with an industry. Such a machine could be used for mining, construction, farming, transportation or any other industry known in the art. For example, component 15 may be a bearing of a motor used in a hedge trimmer or other types of bearings, a plunger of a fuel injector used in an internal combustion engine, a component of a transmission, a component of a hydraulic system such as a hydraulic pump, a piston, a ring or liner of an engine, a cam or follower, etc.

During routine operation of the machine component 10, surface 20 of the component 15 may undergo frictional contact with another surface. In other words, the surface 20 may rub, slide and/or roll on another surface. For example, contacting surfaces of gears of a gearbox rub, slide or roll on surfaces of other gears. To improve the tribological properties of the surface, a textured coating 50 may be applied to the surface 20.

To apply the textured coating 50, the component 15 may first be subjected to a cleaning process 100 to remove impurities from the surface 20. These impurities may include dirt, oil and/or other residue. The cleaning process 100 may involve ultrasonic cleaning using a cleaning solution. The component may be immersed in a cleaning solution and agitated using ultrasonic waves. The ultrasonic waves may cause bubbles to form and collapse (ultrasonic cavitation) in the cleaning solution loosening and removing (dislodging) impurities from the surface 20 of the component 15. The cleaning solution may be water (deionized or regular water), or a solvent (organic or chemical). The component 15 may be cleaned by the ultrasonic process until the surface 20 is sufficiently clean. In some cases, one or more inspection steps may be instituted during the cleaning operation 100. These inspection steps may involve visual, physical or chemical analyses to determine the presence of impurities on the surface 20. It is contemplated that, in some embodiments, other methods of cleaning the surface 20 may be used in the cleaning process 100.

After impurities are removed from the surface 20 of the component 15, the component 15 may be subjected to a mask application process 200. In the mask application process 200, a mask 25 may be applied to the surface 20 of the component 15. The mask 25 may be applied to create any pattern on the surface 20. This pattern may expose some portions of the surface 20 (exposed region), while covering other portions of the surface 20 below the mask (shadow region). For instance, the mask 25 applied to the surface 20 may form a pattern of lines on the surface 20. These lines may be straight lines, curved lines, parallel lines, intersecting lines or lines of any type. These mask pattern on the surface 20 may have lines of any width, thickness, and pitch. Other patterns like dots or irregular shapes may also be formed by the mask 25 on the surface 20. It is also contemplated that different regions of the surface 20 may have different patterns. In some cases, tribological models (fluid flow models or other models) may be used to determine the pattern of the mask 25 on the surface 20.

The mask 25 may be any material that will form a pattern on the surface 20 of the component 15, survive the conditions of the subsequent coating deposition process 300, and will be removable at the subsequent mask removal process 400. The mask 25 may include a synthetic or an organic resin, which may be applied to the surface 20. In some cases, the resin may include additives, such as adhesion promoters, flow enhancers, viscosity modifiers, etc. After application to the surface 20, the mask 25 may cure or harden in air and adhere to the surface 20. It is also contemplated that the component 15 may be exposed to a particular ambient condition, such as a high temperature environment, to speed up or enhance the hardening process. In some cases, the mask 25 may include an ink or a paint material that is applied to the surface 20 of the component 15. The mask 25 may also include an adhesive tape, which is attached to the surface 20 in a pattern.

The mask 25 may be applied to the surface 20 by any application method. In some cases, a pattern of mask 25 may be painted, brushed or drawn on to the surface 20. The pattern may also be formed on the surface 20 by printing the mask material on to the surface 20 through a stencil or a screen (similar to screen-printing). The stencil may be a part with apertures arranged in a pattern corresponding to a desired mask pattern on the surface 20. The stencil may be placed atop the surface 20, and a quantity of mask material may be placed on top of the stencil. A squeegee may then spread the mask material evenly across the top of the stencil making an image of the apertures on the surface 20. In applications where the surface 20 of the component 15 is curved, the component 15 may also be turned or rotated while the mask material is moved by the squeegee across the stencil. The thickness of the stencil and/or the speed of the squeegee across the stencil may control the thickness of the mask 25 applied to the surface 20. It is also contemplated that other automated, semi-automated or manual processes may be used to apply the mask 25 on the surface 20 of the component 15. For instance, if the mask 25 is an adhesive tape, it may be stuck to the surface 20 of the component.

After the mask 25 is applied to the surface 20 in the desired pattern, a coating 30 may be deposited on the component 15 in a coating deposition process 300. The coating 30 may be deposited on the surface 20 using any technique known in the art. For instance, the coating 30 may be deposited on the surface 20 using a vapor deposition technique, such as chemical vapor deposition or physical vapor deposition. The deposited coating 30 may conform to the shape of the surface 20 with the applied mask 25. The coating deposition process 300 may deposit the coating material on the exposed region of the surface 20 and on the exposed surfaces of mask 25.

Although the coating 30 may be applied for any purpose, in some applications, the coating 30 may improve the tribological properties of the surface 20. The coating 30 may be made of a wear resistant material and/or solid lubricant materials. The coating material may include, among others, doped/undoped amorphous carbon (DLC), amorphous hydrocarbons, metal carbides, metal nitrides, metal dichalcogenides, metal borides or ceramic materials. The coating 30 may also include particles of one material embedded in another material. For instance, the coating 30 may include tungsten carbide particles embedded in a DLC matrix. The tungsten carbide particles may provide the wear resistant properties, while the amorphous carbon matrix may provide lubrication and impact absorbing properties. The coating 30 may also include multi-layer coatings. For instance, the coating 30 may be made of a layer of chromium followed by a layer of tungsten carbide containing DLC. While the tungsten carbide containing DLC layer may improves the tribological properties of the surface 20, the chromium layer may serve as an adhesion layer to improve the adhesion of the tungsten carbide containing DLC layer to the surface 20. It is contemplated that the coating 30 may include any single or multi-layer coating used in the art to improve the tribological properties of a surface.

Following deposition of the coating 30 on the surface 20 of the component 15, the mask 25 may be removed in the mask removal process 400. The mask removal process 400 may involve washing/cleaning the component 15 using a solvent. In some applications, the component 15 may be immersed in a solvent and agitated using an ultrasonic cleaner. The resulting ultrasonic cavitation may dislodge the mask 25 from the surface 20. Along with the dislodged mask 25, the portion of the coating 30 deposited on the mask 25 may also be removed. The solvent used in the mask removal process 400 may be any solution that facilitates removal of the mask 25 from the surface 20. In some cases, ethanol and/or water may be used as the solvent. In some applications, the mask removal process may also include a cleaning/rinsing process (step 500, FIG. 2). The cleaning/rinsing process (step 500) may involve rinsing the component in water (deionized or regular) to remove any traces of the mask, solvent and other materials. In some applications, a separate cleaning step may be omitted if the component exiting the mask removal process 400 is sufficiently clean. Following the mask removal process 400, the component 15 may have a layer of textured coating 50 on its surface 20. The pattern of the textured coating 50 on the surface 20 corresponds to the exposed region (region of the surface not covered by the mask) of the surface 20. That is, the pattern of the textured coating 50 may be a negative image of the pattern of the mask 25.

INDUSTRIAL APPLICABILITY

The disclosed method 1000 of making a textured coating 50 on a surface 20 of a component 15 may be applied to any surface 20 that undergoes frictional contact with another surface, including, but not limited to as fuel injector plungers, gears, pistons, rings, bearings, cams/followers, transmission components and hydraulic system components such as hydraulic pumps. Though the surface 20 may typically be made of metal, it may also be made of other materials. The method provides an inexpensive way of improving the tribological properties of the contacting surfaces without detrimentally affecting the components. The method also provides a way of re-applying the textured coating 50 on the surface 20 when the coating 30 wears off, thus prolonging the life of the component 15. The textured coating 50 improves the tribological properties of the surface 20 both by providing a wear resistant layer and by providing lubricant and/or debris reservoirs on the wear resistant layer.

To illustrate applications of the disclosed method, two embodiments are described. The first embodiment describes a method to create a textured DLC coating on the curved surface (surface 20) of a plunger (component 15) of a fuel injector (machine component 10) of FIG. 1. The second embodiment describes a method of re-applying a textured DLC coating on the surface 20 of the plunger, when the initial coating wears off.

Figure 2:
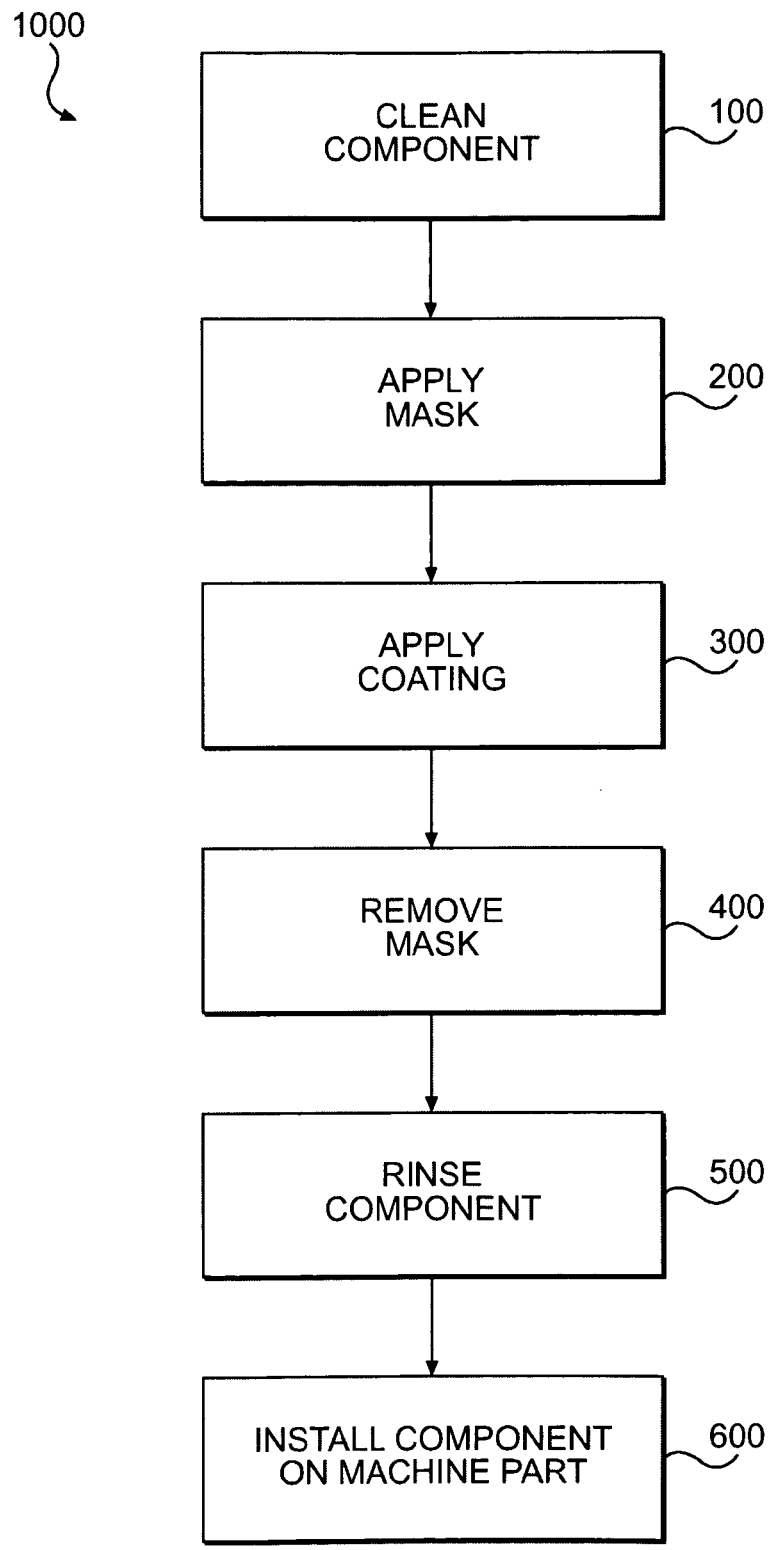
FIG. 2 is a flow chart illustrating an exemplary application of the method of making the textured coating of FIG. 1.

FIG. 2 illustrates the steps involved in the method 1000 of making a textured coating 50 on the surface 20 of the plunger. The plunger is initially cleaned (step 100) using deionized water in an ultrasonic cleaner. After cleaning, surface 20 of the plunger may be visually inspected for impurities. In some applications, the surface 20 may be cleaned for about half an hour to remove most impurities from the surface 20.

When the surface 20 appears free of impurities, a mask 25 may be applied (step 200) to the cleaned surface 20. In some applications, ink from a Sharpie® marker pen may be used as the mask 25. A mask pattern may be sketched on the surface 20. In some applications, the pattern used may be a series of ink dots on the surface 20. However, any mask material and any pattern can be applied to the surface 20.

After the mask pattern is applied (step 300) to the surface 20, a coating 30 may be applied to the cleaned and masked surface 20. Although any deposition process may be used to coat the surface 20, in most applications, a physical vapor deposition (PVD) technique may be used to keep the process temperatures below 500°, such as below 300° or even about 200° or less. The plunger may be placed in the chamber of a closed field unbalanced magnetron-sputtering system containing tungsten carbide and chromium targets. The chamber may be pumped down to a pressure between roughly $10^{-6}$ mbar and roughly $10^{-4}$ and a precursor of argon gas, at a flow rate of about 200-400 SCCM, may be pumped into the chamber. A negative bias of a few hundred volts may be applied to the surface 20 of the plunger for about 20 minutes. The negative bias may cause argon ions to bombard the surface 20 of the plunger and the clean the surface 20 of contamination such as oxides. After about 20 minutes of cleaning, the negative bias on the surface 20 may be removed and the argon gas evacuated from the chamber. Acetylene gas, at a flow rate of 100-200 SCCM, may be introduced into the chamber and a negative bias applied to the chromium target. The negative bias on the chromium target may cause ion bombardment of the target releasing chromium atoms (sputtered), which may deposit on the surface 20. The bias may be switched from the chromium to the tungsten carbide target after about 5 minutes. The tungsten carbide may then be sputtered for roughly 3-4 hours. The acetylene gas may contribute carbon to the coating 30 along with the sputtered tungsten carbide atoms. The resulting coating 30 on the surface 20 may consist of a roughly 100 nanometer layer of chromium followed by a roughly 1 micron layer of tungsten carbide atoms (1-10 atomic percent) embedded in an amorphous carbon matrix (DLC). The tungsten carbide atoms may provide hardness and wear resistant properties to the coating 30 while the DLC matrix may provide lubrication properties. Other deposition conditions may be used to control the thicknesses and/or properties of the resulting coating 30. It is also contemplated that other coating materials may be deposited on the surface 20.

After the coating 30 is deposited on the surface 20, the mask 25 (ink) may be removed (step 400). To remove the ink, the plunger may be immersed in a beaker of ethanol and cleaned using an ultrasonic cleaner. The surface 20 may be visually inspected during cleaning. In some applications, after less than an hour of cleaning, the mask 25 and the coating 30 deposited on the mask 25 may be removed. The plunger may then be rinsed in deionized water (step 500), and dried. The resulting plunger with a textured coating 50 on its surface may be installed (step 600) in a fuel injector.

After a period of use of the fuel injection system, the effectiveness of the textured coating decreases due to inevitable wear of the coating 30. Wear of the coating 30 may decrease the thickness of the coating, and thereby the depth of the reservoirs formed on the surface. In extreme cases, the coating 30 may also be substantially worn off the surface 20.

Figure 3:
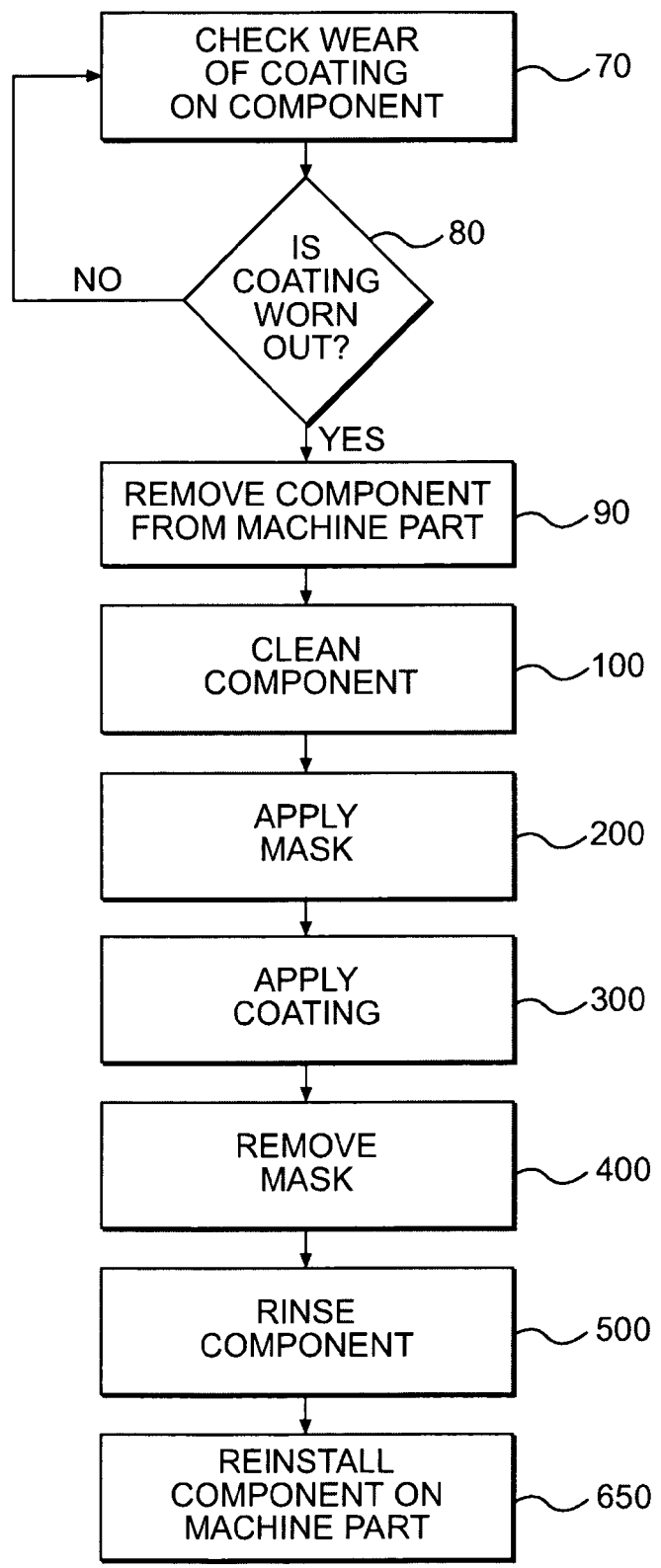
FIG. 3 is a flow chart illustrating another exemplary application of the method of making the textured coating of FIG. 1.

FIG. 3 describes the steps involved in re-applying a textured coating on a surface 20 when the effectiveness of the coating 30 decreases. The coating 30 may be inspected for wear (step 70). The inspection may be performed in-situ, or may involve removing the component 15 from the machine part. Inspection of the coating 30 may involve visually inspecting the surface 20 to detect signs of wear, or measurement of some parameter using measurement tools. For example, the depth or surface texture of the coating 30 may be checked using a surface profilometer.

When inspection indicates that the coating 30 is worn out (step 80), the textured coating 50 may be reapplied. The inspection to detect wear of the coating 30 may be direct visual inspection or may be based on sensors or other means. Determination of when the coating 30 is to be reapplied may be based on experience or mathematical models. In some applications, the coating 30 may be reapplied periodically. If the inspection indicates that the coating 30 is to be reapplied, the component 15 may be removed from the machine component 10 (step 90). In applications where the inspection step (step 70) involves removal of the component 15 from the machine component 10, this step is eliminated. After removal, the component 10 may then be cleaned (step 100), masked (step 200), coated (step 300), unmasked (step 400), and rinsed (step 500) as described earlier. After the textured coating 50 is re-applied on the surface, the component 15 may be re-installed (step 650) in the machine component 10. The same or a different textured coating 50 may be applied to the surface 20 during re-application. The re-application of the textured coating 50 may also be repeated numerous times.

The disclosed method 1000 of making a textured coating 50 on a surface 20 of a component 15 does not expose the component 15 to conditions that may adversely affect the component 15. Since material removal processes such as machining or laser texturing is not involved in creating the textured surface of the disclosed method, the component surface will not be exposed to localized high temperatures that may damage the component 15.

The disclosed method 1000 of making a textured coating 50 creates the texture on the surface during the coating process 300. An additional process step (such as machining) is not required to create the textured pattern. The elimination of a process step to create the texture simplifies the method and enables the creation of complex patterns of texture on the surface. Use of a relatively simple and inexpensive mask to selectively prevent deposition of the coating on some regions (and thereby create the texture pattern), eliminates the need for expensive equipment (laser based or other machining equipment) to create the pattern.

The disclosed method 1000 of making a textured coating 50 also increases the durability of the component 15 by providing a way to reapply the textured coating 50 when an existing coating 30 deteriorates. Unlike texture patterns created by machining, the re-application of the textured coating 50 can be repeatedly performed. Therefore, the durability of the component 15 will not be limited by durability of the textured coating 50.

It will be apparent to those skilled in the art that various modifications and variations can be made to the disclosed method. Other embodiments will be apparent to those skilled in the art from consideration of the specification and practice of the method of making a textured coating. It is intended that the specification and examples be considered as exemplary only, with a true scope being indicated by the following claims and their equivalents.

LIST OF ELEMENTS

10—component
15—component
20—surface
25—mask
30—coating
50—textured coating
70—step
80—step
90—step
100—cleaning operation step
200—mask application step
300—coating step
400—mask removal step
500—cleaning/rinse step
600—installation step
650—reinstallation step
1000—overall method

What is claimed is:

1. A method of making a textured coating on a wear surface of a machine component, the method comprising:
    providing a machine component selected from the group consisting of a fuel injector plunger, a gear, a piston, a ring, a bearing, a cam, a follower, a transmission component, and a hydraulic pump,
    selectively applying a mask on the wear surface of the machine component to create a pattern of exposed portions of the wear surface;
    depositing a tribological coating on the mask and on the pattern of exposed portions of the wear surface such that the tribological coating conforms to the shape of the wear surface with the mask, the tribological coating on the exposed portions creating a tribological pattern of intersecting lines raised above the wear surface; and
    removing the mask along with the tribological coating deposited on the mask to leave the tribological pattern on the wear surface and to create reservoirs between the intersecting lines of the tribological pattern,
    wherein the tribological pattern provides wear resistance and the reservoirs provide areas where lubricant and/or debris can accumulate.

2. The method of claim 1, wherein the wear surface further includes a shadow portion, and wherein during the step of selectively applying a mask the shadow portion is covered by the mask and the exposed portions are not covered by the mask.

3. The method of claim 2, wherein creating of the tribological pattern further includes creating the pattern using printing technology.

4. The method of claim 2, wherein the tribological pattern includes a series of parallel and perpendicular intersecting lines.

5. The method of claim 2, wherein the mask includes a resin.

6. The method of claim 2, wherein the mask includes an ink.

7. The method of claim 1, wherein depositing the tribological coating includes depositing the tribological coating using physical vapor deposition at a temperature less than 500° C.

8. The method of claim 1, wherein removing the mask includes removing the mask using a solvent in an ultrasonic cleaner.

9. The method of claim 1, wherein the tribological pattern includes diamond like carbon.

10. The method of claim 1, further including:
checking the tribological pattern for a condition indicating a wear of the tribological pattern, and
reapplying a second tribological pattern over the tribological pattern on the surface when the condition indicates wear.

11. The method of claim 10, wherein reapplying another tribological pattern includes masking the surface.

12. A method of making a textured coating on a wear surface of a machine component, the method comprising:
providing a machine component selected from the group consisting of a fuel injector plunger, a gear, a piston, a ring, a bearing, a cam, a follower, a transmission component, and a hydraulic pump,
applying a first mask to the wear surface to create a first pattern of exposed portions of the wear surface and shadow portions covered by the first mask;
depositing a first tribological coating on the wear surface using a physical vapor deposition process at a temperature of less than 300° C., the tribological coating covering the first mask and the exposed portions;
removing the first mask along with the tribological coating deposited on the first mask to obtain a first tribological pattern that includes a plurality of intersecting lines above the wear surface;
operating the machine component such that the first tribological pattern will be subject to wear; and
depositing a second tribological pattern that includes a plurality of intersecting lines on the wear surface of the machine component;
wherein the second tribological pattern provides a wear resistance and a second pattern of exposed portions that provide areas where lubricant and/or debris can accumulate.

13. The method of claim 12 wherein depositing the second tribological coating pattern includes:
applying a second mask to the surface in a second pattern,
depositing a second tribological coating on the wear surface of the machine component, and
removing the second mask to obtain a second tribological pattern.

14. The method of claim 12, further including inspecting the first tribological pattern for wear, and the depositing of the second tribological pattern occurs when the inspection indicates wear.

15. The method of claim 13, wherein at least one of the first tribological pattern or the second tribological pattern includes diamond like carbon.

16. A method of making a coating on a wear surface of a machine component selected from the group consisting of a fuel injector plunger, a gear, a piston, a ring, a bearing, a cam, a follower, a transmission component, and a hydraulic pump, the method comprising:
attaching a resin mask to the wear surface of the machine component to selectively cover shadow portions of the wear surface of the machine component and expose a pattern of exposed portions of the wear surface that includes a plurality of intersecting lines;
applying a coating on the pattern of exposed portions and on the resin mask using a physical vapor deposition process at a temperature of less than 200° C. to create a coating pattern of intersecting lines that is raised above the wear surface; and
removing the resin mask along with the coating deposited on the resin mask from the wear surface after applying the coating.

17. The method of claim 16, wherein the resin mask includes an ink.

18. The method of claim 16, wherein the coating includes diamond like carbon.

* * * * *